United States Patent
Konstadinidis

(10) Patent No.: US 7,961,034 B2
(45) Date of Patent: Jun. 14, 2011

(54) MICROPROCESSOR PERFORMANCE IMPROVEMENT BY DYNAMIC NBTI COMPENSATION THROUGH TRANSISTOR FORWARD BIASING

(75) Inventor: Georgios K. Konstadinidis, Santa Clara, CA (US)

(73) Assignee: Oracle America, Inc., Redwood City, CA (US)

(*) Notice: Subject to any disclaimer, the term of this patent is extended or adjusted under 35 U.S.C. 154(b) by 191 days.

(21) Appl. No.: 12/389,614

(22) Filed: Feb. 20, 2009

(65) Prior Publication Data

US 2010/0214007 A1    Aug. 26, 2010

(51) Int. Cl.
*G05F 1/10* (2006.01)
(52) U.S. Cl. ......................... 327/535; 327/534
(58) Field of Classification Search .................. None
See application file for complete search history.

(56) References Cited

U.S. PATENT DOCUMENTS

| | | | |
|---|---|---|---|
| 6,448,840 B2 * | 9/2002 | Kao et al. ................ 327/534 |
| 6,623,992 B1 * | 9/2003 | Haehn et al. ............. 438/11 |
| 6,967,522 B2 * | 11/2005 | Chandrakasan et al. ...... 327/534 |
| 7,120,804 B2 * | 10/2006 | Tschanz et al. ............ 713/300 |
| 7,190,190 B1 * | 3/2007 | Camarota et al. ........... 326/38 |
| 7,216,310 B2 * | 5/2007 | Chatterjee et al. ........... 716/2 |
| 7,268,575 B1 * | 9/2007 | Chen et al. .............. 324/762.09 |
| 7,405,589 B2 * | 7/2008 | Lewis et al. ............... 326/38 |
| 7,453,311 B1 * | 11/2008 | Hart et al. ............... 327/534 |
| 7,535,305 B1 * | 5/2009 | Li et al. .................. 330/298 |
| 7,562,233 B1 * | 7/2009 | Sheng et al. .............. 713/300 |
| 2005/0134361 A1 * | 6/2005 | Tschanz et al. ............ 327/534 |
| 2006/0132218 A1 * | 6/2006 | Tschanz et al. ............ 327/534 |
| 2008/0246533 A1 * | 10/2008 | Barrows et al. ............ 327/534 |
| 2009/0190413 A1 * | 7/2009 | Hsu et al. ............... 365/189.09 |

* cited by examiner

*Primary Examiner* — Thomas J Hiltunen
(74) *Attorney, Agent, or Firm* — Osha • Liang LLP

(57) ABSTRACT

A method for compensating negative bias temperature instability (NBTI) effects on a given model of transistors includes monitoring the NBTI effects on the transistors over time, determining a change in a threshold voltage of the transistors over time based on the monitoring, determining a forward bias voltage based on the change in threshold voltage, and applying the forward bias voltage to the transistors over time. The method may further include storing the monitoring results in a lookup table, and adjusting the forward bias voltage based on the lookup table. The monitoring may include emulating the NBTI effects on a system comprising a plurality of semiconductor devices in which the transistors are used.

15 Claims, 2 Drawing Sheets

MICROPROCESSOR PERFORMANCE IMPROVEMENT BY DYNAMIC NBTI COMPENSATION THROUGH TRANSISTOR FORWARD BIASING

BACKGROUND OF INVENTION

1. Field of the Invention

The present disclosure relates generally to methods for compensating negative bias temperature instability (NBTI) effects on transistors.

2. Background Art

NBTI is an electrochemical reaction that causes transistors to degrade in performance over time. For example, NBTI may adversely affect life-time reliability of a transistor, e.g., metal-oxide semiconductor field-effect transistor (MOSFET), when negative bias is applied to the gate terminal of the transistor. This causes the threshold voltage of the transistor to increase and the drive current of the transistor to decrease over time.

The NBTI effects are particularly severe for p-type MOSFETS (PMOS). When the PMOS gate is turned on, NBTI causes the threshold voltage of the PMOS to gradually increase, even under static conditions. Consequently, the current driving capability of the PMOS and overall speed of operation of the device in which the PMOS is utilized, e.g., microprocessor, degrade over time. The resulting frequency loss in the microprocessor leads to direct thread-performance loss. Therefore, NBTI effects on PMOS are an important consideration in optimizing the performance and operational lifetime of transistor devices.

SUMMARY OF INVENTION

In one aspect, the present disclosure relates generally to a method for compensating negative bias temperature instability (NBTI) effects on a given model of transistors, the method including monitoring the NBTI effects on the transistors over time, determining a change in a threshold voltage of the transistors over time based on the monitoring, determining a forward bias voltage based on the change in threshold voltage, and applying the forward bias voltage to the transistors over time to compensate for the NBTI effects.

In another aspect, the present disclosure relates generally to a computer-readable medium comprising instructions for causing a computer to compensate NBTI effects on a given model of transistors by: monitoring the NBTI effects on the transistors over time, determining a change in a threshold voltage of the transistors over time based on the monitoring, determining a forward bias voltage based on the change in threshold voltage, and applying the forward bias voltage to the transistors over time to compensate for the NBTI effects.

In another aspect, the present disclosure relates generally to a computer system including memory, a processor operatively connected to the memory, and computer-readable instructions stored in the memory for causing the processor to perform: monitoring NBTI effects on a given model of transistors over time, determining a change in a threshold voltage of the transistors over time based on the monitoring, determining a forward bias voltage based on the change in threshold voltage, and applying the forward bias voltage to the transistors over time to compensate for the NBTI effects.

Other aspects and advantages of the invention will be apparent from the following description and the appended claims.

DETAILED DESCRIPTION

Exemplary embodiments of the present disclosure will be described with reference to the accompanying figure.

In the following detailed description of embodiments, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Embodiments of the present invention relate to methods for compensating long-term NBTI effects on transistors and devices in which the transistors are used, e.g., microprocessors. In one or more embodiments, forward bias is applied to a transistor over time to compensate for the threshold voltage shift caused by NBTI and to keep transistor leakage constant. Forward bias is applied gradually and only as much as necessary to compensate for the NBTI effects, so as to avoid unnecessary power consumption.

The following description focuses on PMOS for example purposes because NBTI effects are known to be particularly harmful in PMOS. The teachings of the present disclosure, however, are not limited to PMOS devices.

Figure 1:
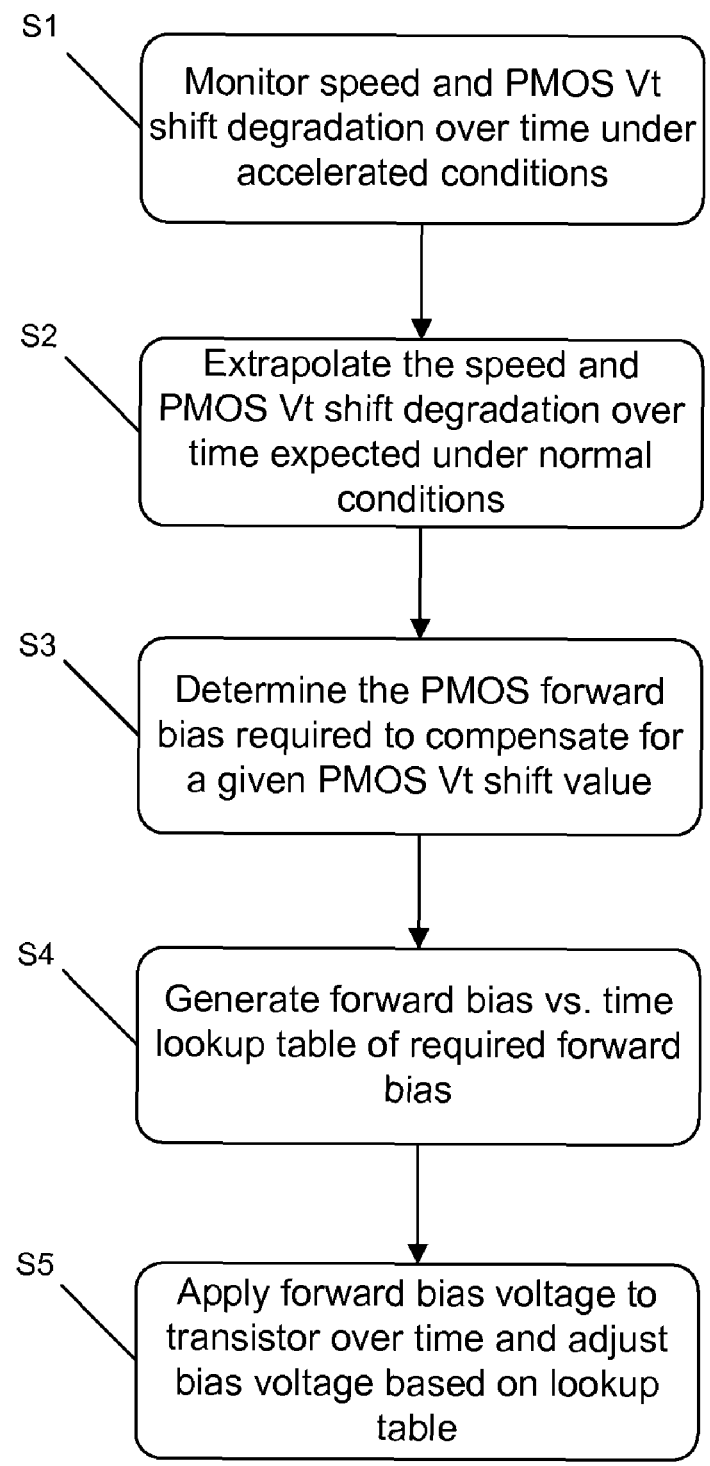
FIG. 1 shows a flowchart of an NBTI compensation process in accordance with an embodiment of the present invention.

According to one or more embodiments, applying forward bias to a source-body junction of a PMOS reduces the effects of NBTI and prevents the PMOS threshold voltage from increasing over time. An appropriate forward bias voltage to be applied over time may be product- or system-specific. FIG. 1 illustrates a flowchart of an NBTI compensation process according to one embodiment of the present invention.

According to the embodiment shown, to determine the proper level of forward bias, the NBTI degradation effects on the PMOS over the operational lifetime of the system are monitored. First, the system speed degradation and the PMOS threshold voltage (Vt) shift degradation over time are monitored under accelerated conditions (S1). For example, the system may be placed under accelerated stress conditions to emulate the effects of NBTI degradation over time. A number of checkpoints may be used to measure the frequency degradation. This emulates the degradation over the lifetime of the system in an accelerated fashion. Then, the speed and PMOS Vt shift degradation over time that would be expected under normal operating conditions are extrapolated (S2). Based on the extrapolation, the amount of PMOS forward bias voltage required to compensate for a given PMOS Vt shift value is determined (S3). The resulting data may be stored and used to generate a lookup table to be used by all microprocessors within the same system (S4). Once the data is collected and stored in the lookup table, a forward bias voltage required to compensate for a given Vt shift can be found. Finally, the forward bias voltage is applied to the PMOS over time, and adjustments to the forward bias voltage are made based on the lookup table (S5).

For example, in an emulation of a particular system, a 30 mV increase in PMOS threshold voltage may be observed over a span of seven years in the NBTI voltage shift emulation. This data can then be used to determine the amount of forward bias voltage that would be appropriate to compensate for the voltage shift. The results may be stored in a lookup table, and the PMOS forward bias voltage may be adjusted accordingly based on the lookup table.

Those skilled in the art will appreciate many variations to the process shown in FIG. 1 that are within the spirit of the invention. For example, in one or more embodiments, integrated circuit quiescent current (IDDQ testing) may be used to determine the amount of forward bias that would compensate for the speed degradation caused by the voltage shift. Specifically, the IDDQ can be monitored over time and the forward bias can be applied to the PMOS such that the IDDQ of the PMOS is maintained at a predefined level.

Figure 2:
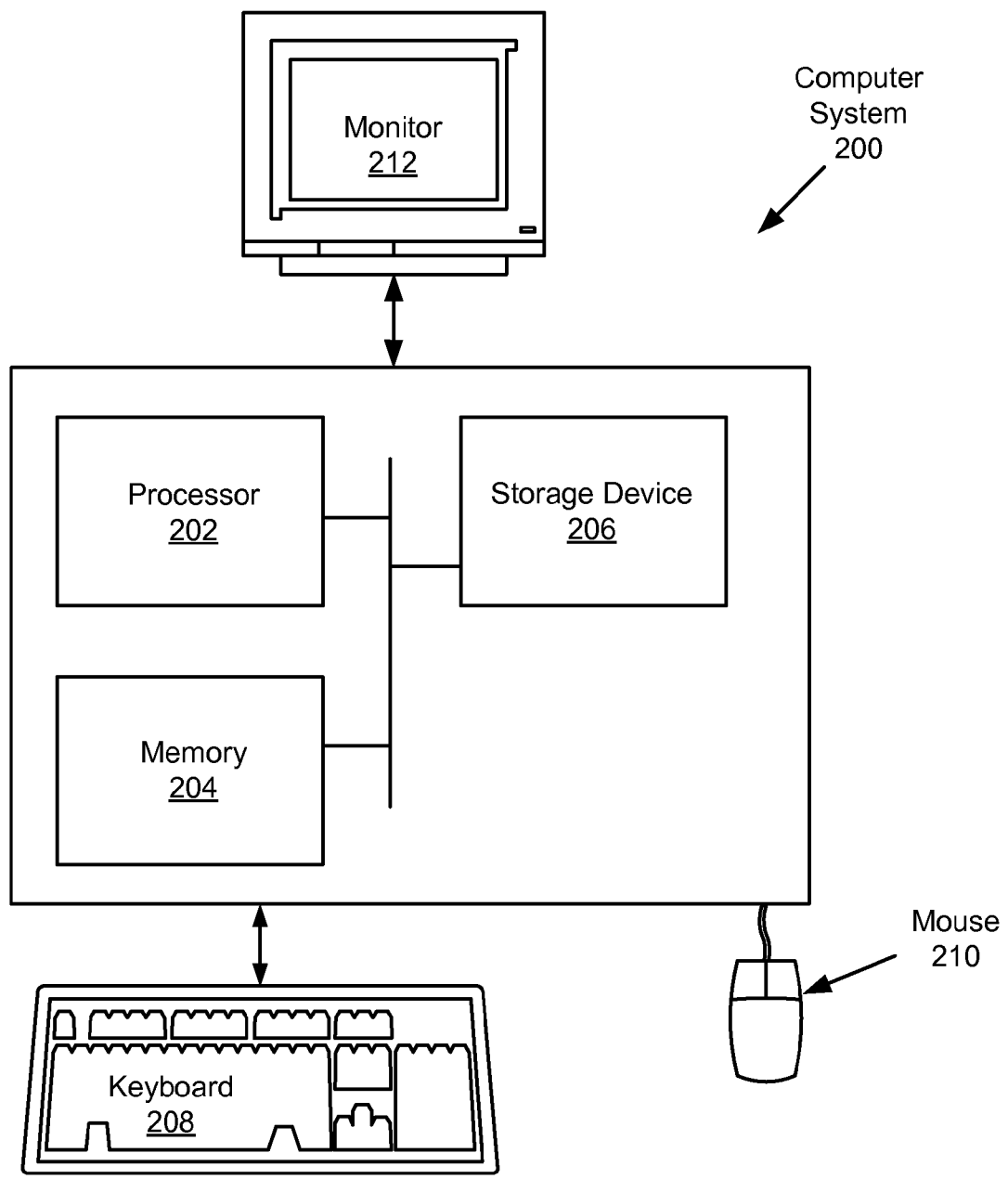
FIG. 2 shows a computer system in accordance with an embodiment of the present invention.

The process described above may be implemented on any type of computer system. For example, as shown in FIG. 2, a computer system 200 includes a processor 202, associated memory 204, a storage device 206, and numerous other elements and functionalities typical of today's computers (not shown). The memory 204 may include instructions for causing the processor 202 to perform the NBTI compensation process in accordance with one or more embodiments of the present invention. The computer 200 may also include input means, such as a keyboard 208 and a mouse 210, and output means, such as a monitor 212. The computer system 200 is connected to a local area network (LAN) or a wide area network (e.g., the Internet) (not shown) via a network interface connection (not shown). Those skilled in the art will appreciate that these input and output means may take other forms, now known or later developed.

Further, those skilled in the art will appreciate that one or more elements of the aforementioned computer system 200 may be located at a remote location and connected to the other elements over a network. Further, the invention may be implemented on a distributed system having a plurality of nodes, where each portion of the invention (e.g., intrusion detection system, response rewriter, server, client) may be located on a different node within the distributed system. In one embodiment of the invention, the node corresponds to a computer system. Alternatively, the node may correspond to a processor with associated physical memory. The node may alternatively correspond to a processor with shared memory and/or resources. Further, software instructions to perform embodiments of the invention may be stored on a tangible computer readable medium such as a digital video disc (DVD), compact disc (CD), a diskette, a tape, or any other suitable tangible computer readable storage device.

Advantages of embodiments of the present invention may include one or more of the following. According to one or more embodiments of the present invention, NBTI compensation through forward biasing effectively compensates the PMOS threshold voltage over time. As a result, speed and power of the PMOS device can be maintained over the lifetime of the device. This makes it unnecessary to add frequency margins at production frequency binning, which penalizes the design's performance. By determining the proper amount of forward bias voltage and applying it gradually over time, the NBTI effects can be compensated without consuming unnecessary power. The NBTI compensation can also prevent the PMOS drive current from decreasing.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for compensating negative bias temperature instability (NBTI) effects on a given model of PMOS transistors in a processor, the method comprising:
   monitoring a plurality of threshold voltage shifts of the PMOS transistors on an emulated time scale under accelerated stress conditions to emulate the effects of NTBI degradation of the PMOS transistors over an actual lifetime of the PMOS transistors;
   extrapolating a plurality of expected threshold voltage shifts of the PMOS transistors corresponding to normal operating conditions over the lifetime of the PMOS transistors based on the monitoring;
   determining a plurality of forward bias voltages for the PMOS transistors based on the plurality of expected threshold voltage shifts, wherein each forward bias voltage is sufficient to compensate for the corresponding one expected threshold voltage shift;
   storing the plurality of forward bias voltages for the PMOS transistors in a lookup table accessible by the processor; and
   during runtime, applying a selected forward bias voltage to the PMOS transistors, wherein the selected forward bias voltage is one of the plurality of forward bias voltages stored in the lookup table that corresponds to a time in the lifetime of the PMOS transistors corresponding to the runtime.

2. The method according to claim 1, further comprising:
   adjusting the forward bias voltage based on the lookup table.

3. The method according to claim 2, wherein the monitoring includes emulating the NBTI effects on a system comprising a plurality of semiconductor devices in which PMOS transistors are used.

4. The method according to claim 3, wherein the same lookup table is used to adjust the forward bias voltage on PMOS transistors in the plurality of semiconductor devices.

5. The method according to claim 1, further comprising:
   monitoring an integrated circuit quiescent current (IDDQ) of the PMOS transistors; and
   adjusting the forward bias voltage on the transistors such that the IDDQ of the PMOS transistors is maintained at a predefined level.

6. A non-transitory computer-readable medium comprising instructions for causing a computer to compensate NBTI effects on a given model of PMOS transistors in a processor by performing:
   monitoring a plurality of threshold voltage shifts of the PMOS transistors on an emulated time scale under accelerated stress conditions to emulate the effects of NTBI degradation of the PMOS transistors over an actual lifetime of the PMOS transistors;
   extrapolating a plurality of expected threshold voltage shifts of the PMOS transistors corresponding to normal operating conditions over the lifetime of the PMOS transistors based on the monitoring;
   determining a plurality of forward bias voltages for the PMOS transistors based on the plurality of expected threshold voltage shifts, wherein each forward bias voltage is sufficient to compensate for the corresponding one expected threshold voltage shift;
   storing the plurality of forward bias voltages for the PMOS transistors in a lookup table accessible by the processor; and
   during runtime, applying a selected forward bias voltage to the PMOS transistors, wherein the selected forward bias voltage is one of the plurality of forward bias voltages stored in the lookup table that corresponds to a time in the lifetime of the PMOS transistors corresponding to the runtime.

7. The computer-readable medium according to claim 6, further comprising instructions for causing the computer to perform:
  adjusting the forward bias voltage based on the lookup table.

8. The computer-readable medium according to claim 7, wherein the monitoring includes emulating the NBTI effects on a system comprising a plurality of semiconductor devices in which PMOS transistors are used.

9. The computer-readable medium according to claim 8, wherein the same lookup table is used to adjust the forward bias voltage on the PMOS transistors in the plurality of semiconductor devices.

10. The computer-readable medium according to claim 6, further comprising instructions for causing the computer to perform:
  monitoring an integrated circuit quiescent current (IDDQ) of the PMOS transistors; and
  adjusting the forward bias voltage on the transistors such that the IDDQ of the PMOS transistors is maintained at a predefined level.

11. A computer system comprising:
  memory;
  a processor operatively connected to the memory; and
  computer-readable instructions stored in the memory for causing the processor to perform:
    monitoring a plurality of threshold voltage shifts of the PMOS transistors on an emulated time scale under accelerated stress conditions to emulate the effects of NTBI degradation of the PMOS transistors over an actual lifetime of the PMOS transistors;
    extrapolating a plurality of expected threshold voltage shifts of the PMOS transistors corresponding to normal operating conditions over the lifetime of the PMOS transistors based on the monitoring;
    determining a plurality of forward bias voltages for the PMOS transistors based on the plurality of expected threshold voltage shifts, wherein each forward bias voltage is sufficient to compensate for the corresponding one expected threshold voltage shift;
    storing the plurality of forward bias voltages for the PMOS transistors in a lookup table accessible by the processor; and
    during runtime, applying a selected forward bias voltage to the PMOS transistors, wherein the selected forward bias voltage is one of the plurality of forward bias voltages stored in the lookup table that corresponds to a time in the lifetime of the PMOS transistors corresponding to the runtime.

12. The computer system according to claim 11, further comprising instructions for causing the processor to perform:
  adjusting the forward bias voltage based on the lookup table.

13. The computer system according to claim 12, wherein the monitoring includes emulating the NBTI effects on a system comprising a plurality of semiconductor devices in which PMOS transistors are used.

14. The computer system according to claim 13, wherein the same lookup table is used to adjust the forward bias voltage on the PMOS transistors in the plurality of semiconductor devices.

15. The computer system according to claim 11, further comprising instructions for causing the processor to perform:
  monitoring an integrated circuit quiescent current (IDDQ) of the PMOS transistors; and
  adjusting the forward bias voltage on the transistors such that the IDDQ of the PMOS transistors is maintained at a predefined level.

* * * * *